United States Patent
Chang et al.

(10) Patent No.: US 8,642,473 B2
(45) Date of Patent: Feb. 4, 2014

(54) METHODS FOR CONTACT CLEAN

(75) Inventors: Mei Chang, Saratoga, CA (US); Linh Thanh, Cupertino, CA (US); Bo Zheng, Saratoga, CA (US); Arvind Sundarrajan, San Jose, CA (US); John C. Forster, Mountian View, CA (US); Umesh M. Kellkar, Santa Clara, CA (US); Murali K. Narasimhan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 48 days.

(21) Appl. No.: 13/411,398

(22) Filed: Mar. 2, 2012

(65) Prior Publication Data
US 2012/0225558 A1 Sep. 6, 2012

Related U.S. Application Data

(60) Provisional application No. 61/449,410, filed on Mar. 4, 2011.

(51) Int. Cl.
*H01L 21/311* (2006.01)
(52) U.S. Cl.
USPC ........... 438/694; 438/689; 438/706; 438/710; 438/719; 438/740; 216/58; 216/67; 216/74; 216/79

(58) Field of Classification Search
None
See application file for complete search history.

(56) References Cited

U.S. PATENT DOCUMENTS

| | | | |
|---|---|---|---|
| 6,207,487 B1 | 3/2001 | Kim et al. | |
| 6,242,808 B1 | 6/2001 | Shimizu et al. | |
| 6,251,242 B1 | 6/2001 | Fu et al. | |
| 6,277,249 B1 | 8/2001 | Gopalraja et al. | |
| 6,284,646 B1 | 9/2001 | Leem | |
| 6,305,314 B1 | 10/2001 | Sneh et al. | |
| 6,335,240 B1 | 1/2002 | Kim et al. | |
| 6,344,419 B1 | 2/2002 | Forster et al. | |
| 6,348,376 B2 | 2/2002 | Lim et al. | |
| 6,358,829 B2 | 3/2002 | Yoon et al. | |
| 6,372,598 B2 | 4/2002 | Kang et al. | |
| 6,399,491 B2 | 6/2002 | Jeon et al. | |
| 6,416,822 B1 | 7/2002 | Chiang et al. | |
| 6,428,859 B1 | 8/2002 | Chiang et al. | |
| 6,451,119 B2 | 9/2002 | Sneh et al. | |
| 6,451,695 B2 | 9/2002 | Sneh | |
| 6,458,701 B1 | 10/2002 | Chae et al. | |
| 6,464,779 B1 | 10/2002 | Powell et al. | |

(Continued)

OTHER PUBLICATIONS

PCT international search report and written opinion of PCT/US2012/027592 dated Dec. 10, 2012.

*Primary Examiner* — Lan Vinh
*Assistant Examiner* — Jiong-Ping Lu
(74) *Attorney, Agent, or Firm* — Patterson & Sheridan, LLP

(57) ABSTRACT

Methods and apparatus for removing oxide from a surface, the surface comprising at least one of silicon and germanium, are provided. The method and apparatus are particularly suitable for removing native oxide from a metal silicide layer of a contact structure. The method and apparatus advantageously integrate both the etch stop layer etching process and the native oxide removal process in a single chamber, thereby eliminating native oxide growth or other contaminates redeposit during the substrate transfer processes. Furthermore, the method and the apparatus also provides the improved three-step chemical reaction process to efficiently remove native oxide from the metal silicide layer without adversely altering the geometry of the contact structure and the critical dimension of the trenches or vias formed in the contact structure.

23 Claims, 8 Drawing Sheets

(56) References Cited

U.S. PATENT DOCUMENTS

| | | |
|---|---|---|
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,585,823 B1 | 7/2003 | Van Wijck |
| 6,599,572 B2 | 7/2003 | Saanila et al. |
| 6,607,976 B2 | 8/2003 | Chen et al. |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,660,660 B2 | 12/2003 | Haukka et al. |
| 6,686,271 B2 | 2/2004 | Raaijmakers et al. |
| 2002/0124867 A1 | 9/2002 | Kim et al. |
| 2003/0059538 A1 | 3/2003 | Chung et al. |
| 2004/0067635 A1 | 4/2004 | Wu et al. |
| 2005/0064721 A1 | 3/2005 | Tsai et al. |
| 2005/0142845 A1 | 6/2005 | Lee et al. |
| 2005/0158986 A1* | 7/2005 | Wu et al. .................. 438/634 |
| 2006/0157079 A1* | 7/2006 | Kim et al. .................. 134/1.1 |
| 2007/0209931 A1 | 9/2007 | Miller |

\* cited by examiner

METHODS FOR CONTACT CLEAN

CROSS REFERENCE TO RELATED APPLICATIONS

This application claims benefit of U.S. Provisional Patent Application No. 61/449,410, filed Mar. 4, 2011, which is incorporated by reference in its entirety.

BACKGROUND OF THE INVENTION

1. Field of the Invention

Embodiments of the present invention generally relate to methods for forming semiconductor devices. More particularly, embodiments of the present invention generally relate to methods for pre-cleaning metal contacts on a semiconductor substrate.

2. Description of the Related Art

Metal gates or contacts typically include a doped silicon surface, one or more barrier layers, one or more liner layers and bulk metal to complete the gate structure. The cleanliness of the substrate surface between layers is critical for reducing contact resistance and hence, optimal device performance. For logic devices, the contact is usually a silicide, such as nickel silicide, cobalt silicide, or titanium silicide. Nickel silicide is becoming more popular for smaller geometries, e.g., geometries having aspect ratios of about 10:1 or smaller, because nickel silicide is widely available and has a lower resistivity and lower contact resistance as compared to other metal silicides.

In a typical fabrication process, the metal silicide is formed on a substrate in one vacuum environment and the substrate is then transferred to another vacuum environment to continue the contact interconnection manufacturing process. As a result, the substrate can be subjected to oxidative conditions during the transfer. A clean process is typically conducted prior to the liner/barrier deposition to remove any oxides on the silicide surface which formed during transfer and exposure to the oxidative environment.

FIGS. 1A-1C depicts cross-sectional views of a localized contact structure in a semiconductor device. Typically, a contact structure 100 includes a substrate 102 having a gate structure 108 formed on the substrate 102, as shown in FIG. 1A. Source and drain regions 106, 104 are formed in the substrate 102 adjacent to the gas structure 108. The gate structure 108 includes a gate dielectric 112, a gate electrode 122 and a contact layer 110. The contact layer 110 is also formed in the source 106 and the drain 104 region. The contact layer 110 may be a metal silicide, a silicon based material, a germanium based material, or a silicon based material doped with germanium and/or other dopant. An etch stop layer 116 is formed on the substrate 102 covering the gate structure 108. The etch stop layer 116 is typically made by a silicon dielectric layer, such as a SiN layer. A contact dielectric layer 118 is then deposited over the substrate 102.

FIG. 2 depicts a flow chart conventionally utilized to manufacture a contact structure 100 depicted in FIGS. 1A-1C. When manufacturing the contact structure 100, a contact etching process is performed to etch the contact dielectric layer 118 and the etch stop layer 116 so as to form vias/trenches 120, as shown in FIG. 1B, in the contact dielectric layer 118 and the etch stop layer 116, as described at step 202 in FIG. 2. It is noted that conventionally, the dielectric layer 118 and the etch stop layer 116 individually are etched in separate steps. After the etching process, a top surface 150 and an upper surface 152 of the contact layer 110 are exposed, as shown in FIG. 1B. At step 204, conventionally, a wet cleaning process is performed to remove etching residuals that may remain on the top surface 150 of the contact layer 110 and the upper surface 152 of the substrate 102. After the wet cleaning process, at step 206, a pre-clean process is performed to remove native oxides formed on the top surface 150 of the contact layer 110, sidewalls 154 of the contact dielectric layer 118 and the upper surface 152 of the contact layer 110. Native oxides may adversely increase contact resistance of the device structure, thereby undesirably resulting in poor electrical performance and device failure. After the pre-clean process, a metallization process, including forming of the barrier layer and the contact metal plug layer 124, is performed at step 208, to complete the metal contact structure formation process, as shown in FIG. 1C.

As discussed above, conventional pre-clean processes utilize physical etch techniques, e.g., sputtering. Sputtering techniques can damage the underlying surface due to resputtering of oxide onto the silicide surface. Sputtering techniques can also change the contact hole geometry due to the physical bombardment of ions on the substrate surface. For example, the contact opening can become widened or tapered which is sometimes referred to as "faceting" due to the nature of the isotropic etch of the physical etch techniques, thereby resulting in critical dimension (CD) widening or enlargement.

Furthermore, substrate transfer between different processing chambers to perform the etch stop layer etching processing, wet cleaning process, and the pre-cleaning process for native oxide removal may expose the substrate to ambient atmosphere, which may adversely increase likelihood of re-growing native oxides and be the source of other contaminates formed on the substrate surface.

Therefore, there is a need for an improved pre-clean process for cleaning the metal gates prior to the contact metallization process.

SUMMARY OF THE INVENTION

Embodiments of the present invention provide methods and apparatus for removing oxide from a surface, the surface comprising at least one of silicon and germanium. The invention is particularly suitable for removing native oxide from a metal silicide layer of a contact structure.

In one embodiment, a method for removing native oxide from a surface disposed on a substrate includes forming a polymer layer on an oxide layer formed on a surface comprising at least one of silicon and germanium, activating the polymer layer to react with the oxide layer to form gas phase byproduct, and performing an ash process to remove the polymer from the substrate.

In another embodiment, a method for forming a contact structure on a substrate comprising includes supplying a polymer gas mixture into a vacuum processing chamber to form a polymer layer on an oxide layer present on a surface exposed through an opening formed through a contact dielectric layer, the surface comprising at least one of silicon and germanium, supplying an etching gas mixture to remove the oxide layer formed on the surface, and performing an ash process to remove the polymer layer remaining on the substrate.

In yet another embodiment, a method for forming a contact structure on a substrate includes etching an etch stop layer formed on a substrate disposed in a vacuum processing chamber to expose an oxide layer formed on a surface of a surface formed beneath the etch stop layer, the surface comprising at least one of silicon and germanium, and removing the oxide layer formed on the surface in the same vacuum processing chamber.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

Figure 1A:
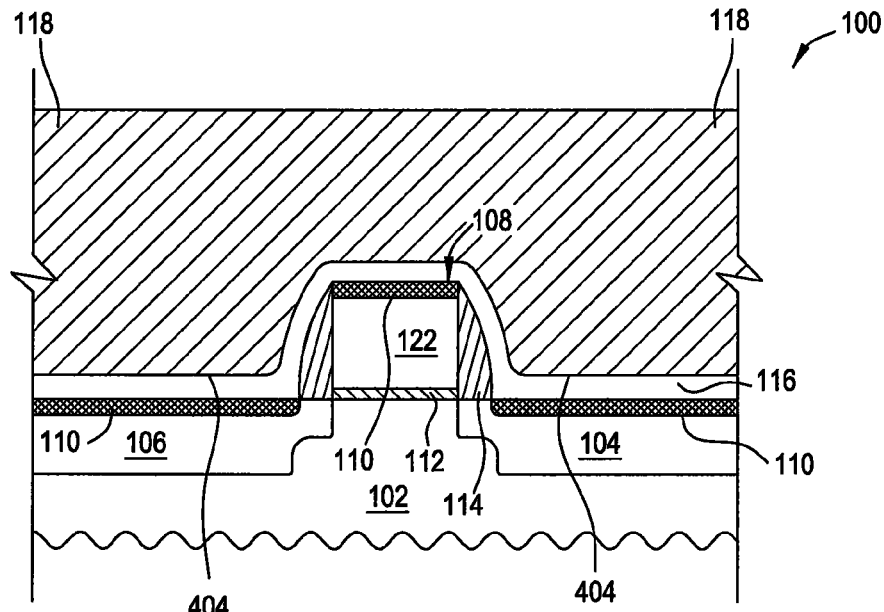
FIGS. 1A-1C depict cross-sectional views of a conventional contact structure during the formation of contact structure in semiconductor devices.
Figure 1B:
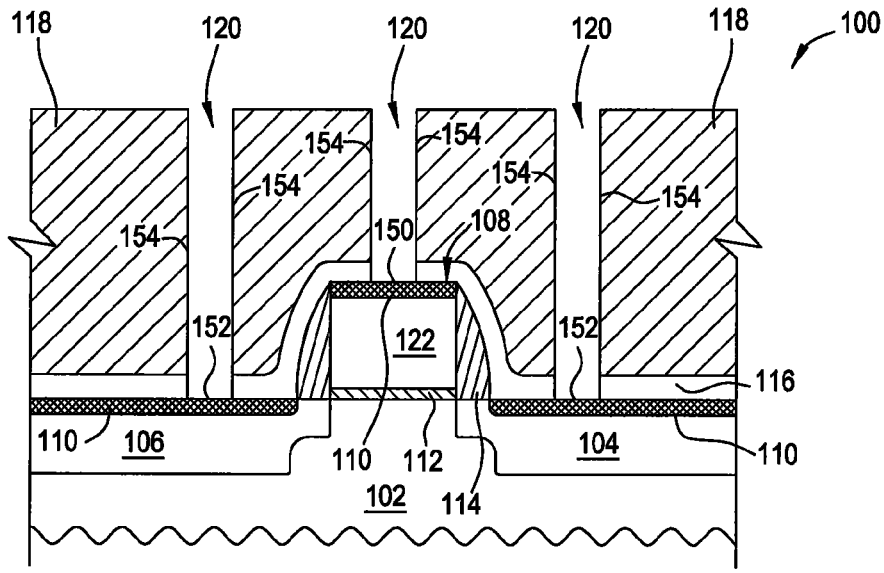
Figure 1C:
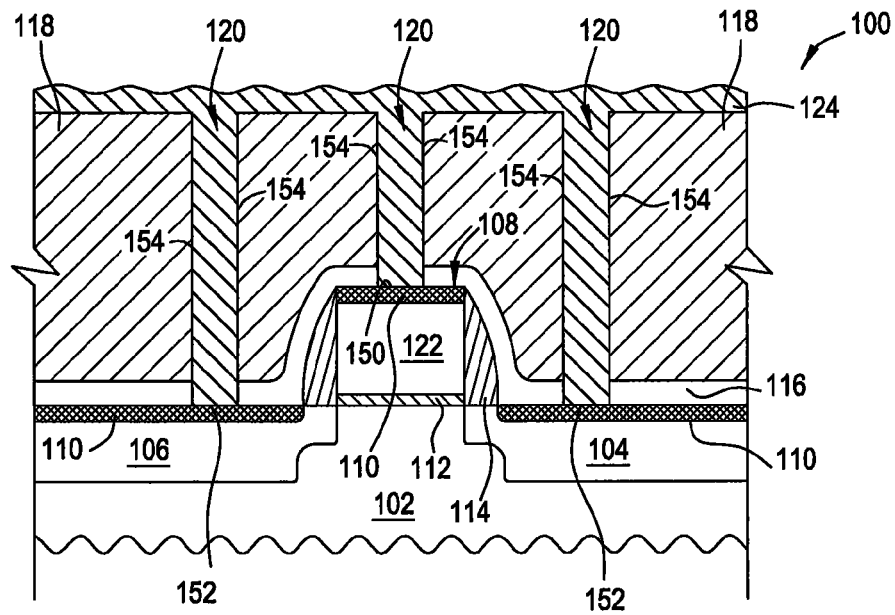

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention provide methods and apparatus for removing oxide from a surface, the surface comprising at least one of silicon and germanium. Certain embodiments are particularly suitable for removing native oxide on a metal silicide layer in a contact structure. The method and apparatus advantageously integrate both the etch stop layer etching process and the native oxide removal process in a single chamber, thereby eliminating native oxide growth or other contaminates redeposit during the substrate transfer processes. Furthermore, the method and the apparatus also provide the improved three-step chemical reaction process to efficiently remove native oxide from the metal silicide layer without adversely altering the geometry of the contact structure and the critical dimension of the trenches or vias formed in the contact structure.

The term "contact structure" as used herein refers to a layer of material that includes a metal silicide that can form part of a gate electrode. In one or more embodiments, the metal silicide can be nickel silicide, cobalt silicide, titanium silicide or any combination thereof. The metal silicide can also include tungsten, tungsten silicide, Ti/Co alloy silicide, Ti/Ni alloy silicide, Co/Ni alloy silicide and Ni/Pt silicide. The contact structure may alternatively be silicon based, germanium based or silicon based with germanium dopant and/or other dopant.

The term "substrate" as used herein refers to a layer of material that serves as a basis for subsequent processing operations and includes a "contact surface." For example, the substrate can include one or more conductive metals, such as aluminum, copper, tungsten alloys, or combinations thereof. The substrate can also include one or more nonconductive materials, such as silicon, silicon oxide, doped silicon, germanium, gallium arsenide, glass, and sapphire. The substrate can also include dielectric materials such as silicon dioxide, organosilicates, and carbon doped silicon oxides. Further, the substrate can include any other materials such as metal nitrides and metal alloys, depending on the application. In one or more embodiments, the substrate can form part of an interconnect feature such as a plug, via, contact, line, and wire.

It is noted that the present invention can also be utilized to remove native oxides on any silicon containing surface, including crystalline silicon, doped silicon, or composited silicon substrate, or to remove native oxides formed in any substrates.

Moreover, the substrate is not limited to any particular size or shape. The substrate can be a round wafer having a 200 mm diameter or a 300 mm diameter. The substrate can also be any polygonal, square, rectangular, curved or otherwise non-circular workpiece, such as a glass substrate used in the fabrication of flat panel displays.

Figure 3:
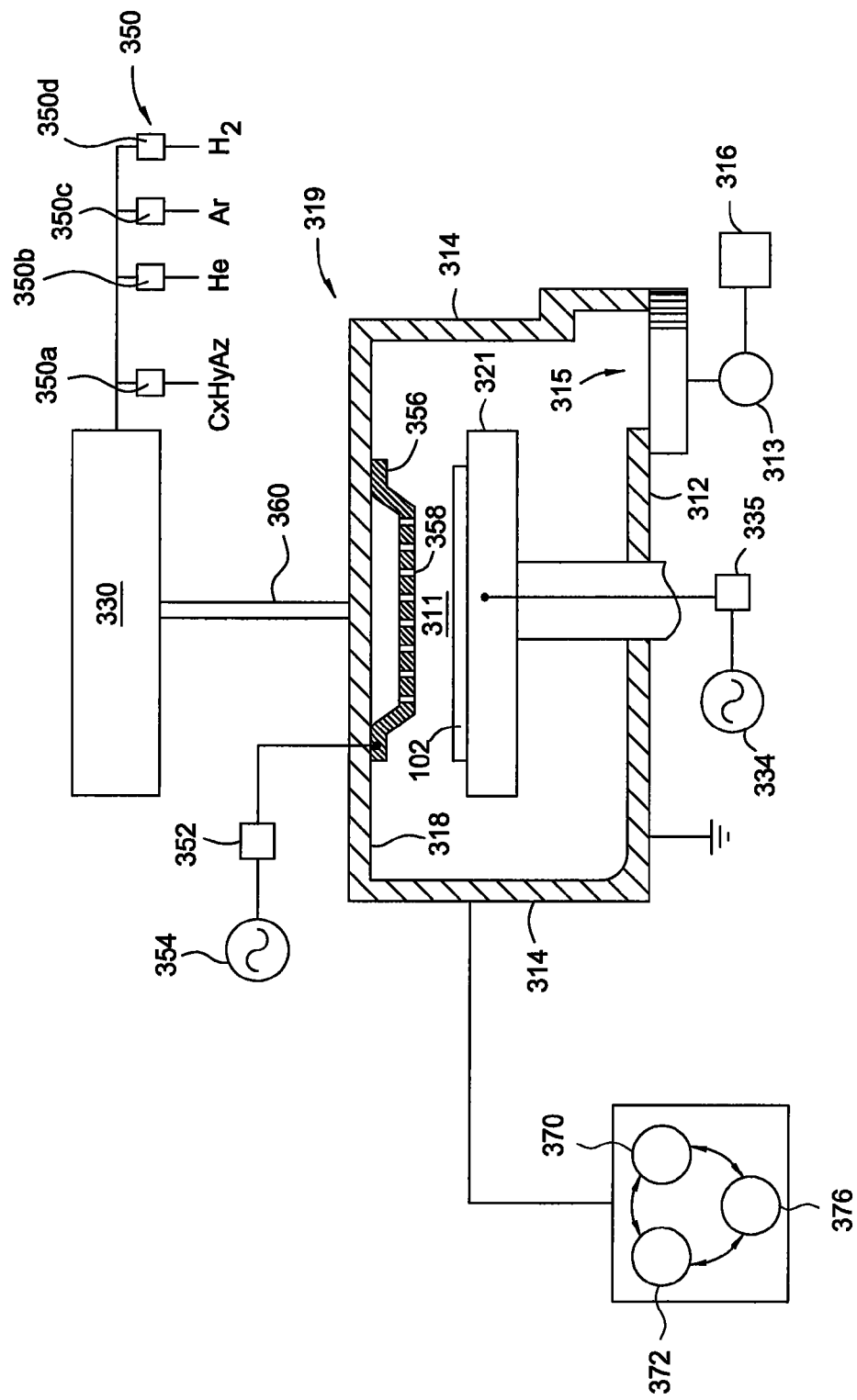
FIG. 3 depicts a cross-sectional view of a processing chamber that may be utilized to perform a pre-clean process or an etching process in accordance with one embodiment of the prevention invention.

FIG. 3 depicts a cross-sectional view of a vacuum processing chamber 319 that may be utilized to perform a cleaning/etching process in accordance with one embodiment of the prevention invention. The vacuum processing chamber 319 may be a Preclean PCII, PCXT or SICONI chambers which are available from Applied Materials, Inc., Santa Clara, Calif. It is noted that vacuum chambers available from other manufactures may also be utilized to practice the present invention.

The vacuum chamber 319 includes a base member 312, sidewalls 314 and a lid 318 which are made of metallic construction such as stainless steel, aluminum or the like. The chamber lid 318, base member 312 and sidewalls 314 define an interior processing region 311 in the chamber 319 for processing. An opening 315 in the base member 312 is connected to a throttle valve 313 and a turbo pump 316 which is used to control the gas pressure inside the chamber 319. The throttle valve 313 is automated to allow the processing region 311 to be maintained at a specific desired pressure.

A gas panel 330 is coupled to the chamber lid 318 and is configured to deliver gases to the chamber 319 through a gas inlet 360. The gas supplied from gas panel 330 and delivered through the gas inlet 360 passes through a gas distribution plate 356 coupled to the chamber lid 318 into the interior processing region 311. The gas panel 330 may supply gases which are metered by mass flow controllers 350 (shown as 350a, 350b, 350c and 350d). Exemplary gases that may be delivered to the chamber 319 include hydrogen carbon halogen containing gas, inert gas, such as helium and argon, hydrogen gas, oxygen containing gas, mixtures thereof and any other suitable gases. The gas distribution plate 356 has a plurality of apertures 358 formed therethrough which allow gases to flow into the interior processing region 311. In one embodiment, the apertures 358 may have different sizes, dimensions, and distributions across in the gas distribution plate 356 so as to deliver gases with different flow rate, flow volume, and/or flow distribution in the interior processing region 311.

A RF power source 354 is coupled to the gas distribution plate 356 to supply a first RF power through a matching network 352 to the gas distribution plate 356 to facilitate generation of a plasma in the interior processing region 311. Alternatively, the RF power sources 354 and matching network 352 may be coupled to an antenna (not shown) disposed exterior to the chamber 319 or other elements disposed in the chamber 319. In one embodiment, the RF source 354 may provide a source RF power between about 10 watts and about 5000 watts at a frequency of about 50 kHz to about 13.6 MHz.

A pedestal 321 is disposed in the chamber 319 through the base member 312 of the chamber 319. The pedestal 321 may be fabricated from aluminum, ceramic, and other suitable materials. The pedestal 321 may be moved in a vertical direction inside the chamber 319 using a displacement mechanism (not shown). The pedestal 321 is configured to receive a substrate 102 thereon for processing. A RF source 334 may apply a second RF power to the pedestal 321 through a RF matching network 335. The RF power 334 may facilitate generating a bias potential to bias the substrate 102 disposed on the pedestal 321 during processing. The second RF power may be applied at RF frequencies from about 2 MHz to about 60 MHz and at power levels from about 10 watts to about 3000 watts.

A controller 370, including a central processing unit (CPU) 372, a memory 374, and support circuits 376 for the CPU 372, is coupled to the various components of the vacuum chamber 319 to facilitate control of the clean process. To facilitate control of the chamber as described above, the CPU 144 may be one of any form of general purpose computer processor that can be used in an industrial setting for controlling various chambers and subprocessors. The memory 374 is coupled to the CPU 372. The memory 374, or computer-readable medium, may be one or more of readily available memory such as random access memory (RAM), read only memory (ROM), floppy disk, hard disk, or any other form of digital storage, local or remote. The support circuits 376 are coupled to the CPU 372 for supporting the processor in a conventional manner. These circuits include cache, power supplies, clock circuits, input/output circuitry and subsystems, and the like. An etching process, such as described herein, is generally stored in the memory 374 as a software routine. The software routine may also be stored and/or executed by a second CPU (not shown) that is remotely located from the hardware being controlled by the CPU 372.

Figure 4:
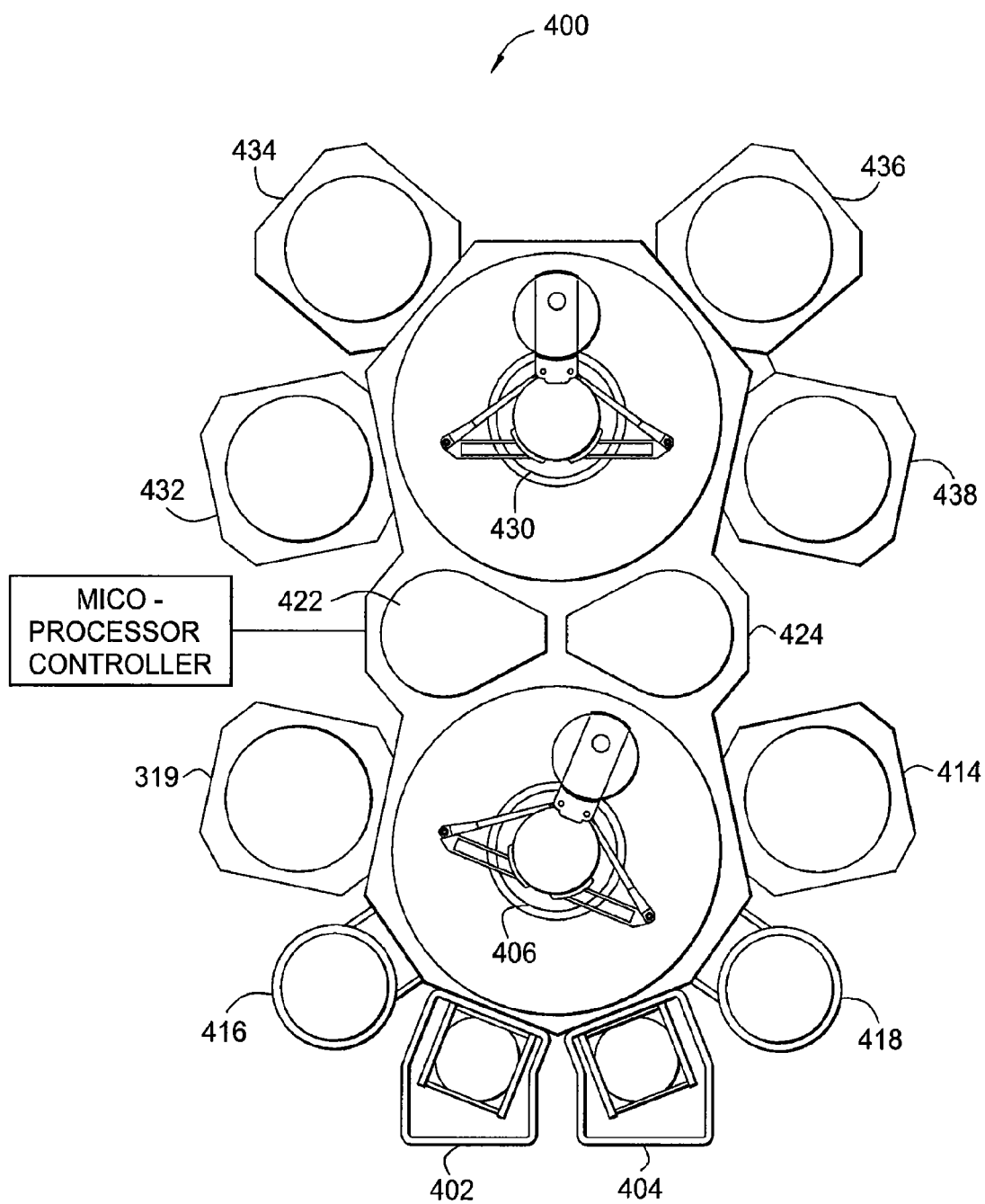
FIG. 4 depicts a schematic top-view diagram of an illustrative multi-chamber processing system.

In one or more embodiments, the vacuum chamber 319 can be integrated into a multi-chamber system 400, as depicted in FIG. 4 that will be further discussed below, such as an ENDURA® Platform available from Applied Materials, Inc., located in Santa Clara, Calif. Such a processing system is capable of performing several processing operations in different chambers without breaking vacuum. Details of illustrative ENDURA® processing systems are described in U.S. Pat. Nos. 5,186,718 and 6,558,509.

Referring to FIG. 4, the multi-chamber processing system 400, can be adapted to perform processes as disclosed herein having the vacuum chamber 319 coupled thereto. The system 400 can include one or more load lock chambers 402, 404 for transferring substrates into and out of the system 400. Since the system 400 is under vacuum, the load lock chambers 402, 404 are utilized to facilitate transfer of substrates from an atmospheric environment into a vacuum environment of the system 400. A first robot 406 is used to transfer the substrates between the load lock chambers 402, 404 and a first set of one or more substrate processing chambers 319, 416, 414, 418 (four are shown), such as the chamber 319 depicted in FIG. 3. Each processing chamber 319, 416, 414, 418, can be outfitted to perform at least one substrate processing operation including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The first robot 406 can also transfer substrates to/from one or more transfer chambers 422, 424. The transfer chambers 422, 424 can be used to maintain different vacuum conditions within different parts of the system 400. A second robot 430 is used transfer the substrates between the transfer chambers 422, 424 and a second set of one or more processing chambers 432, 434, 436, 438. Similar to processing chambers 319, 414, 416, 418, the processing chambers 432, 434, 436, 438 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 414, 416, 418, 432, 434, 436, 438 can be removed from the system 400 if not necessary for a particular process to be performed by the system 400.

Figure 5:
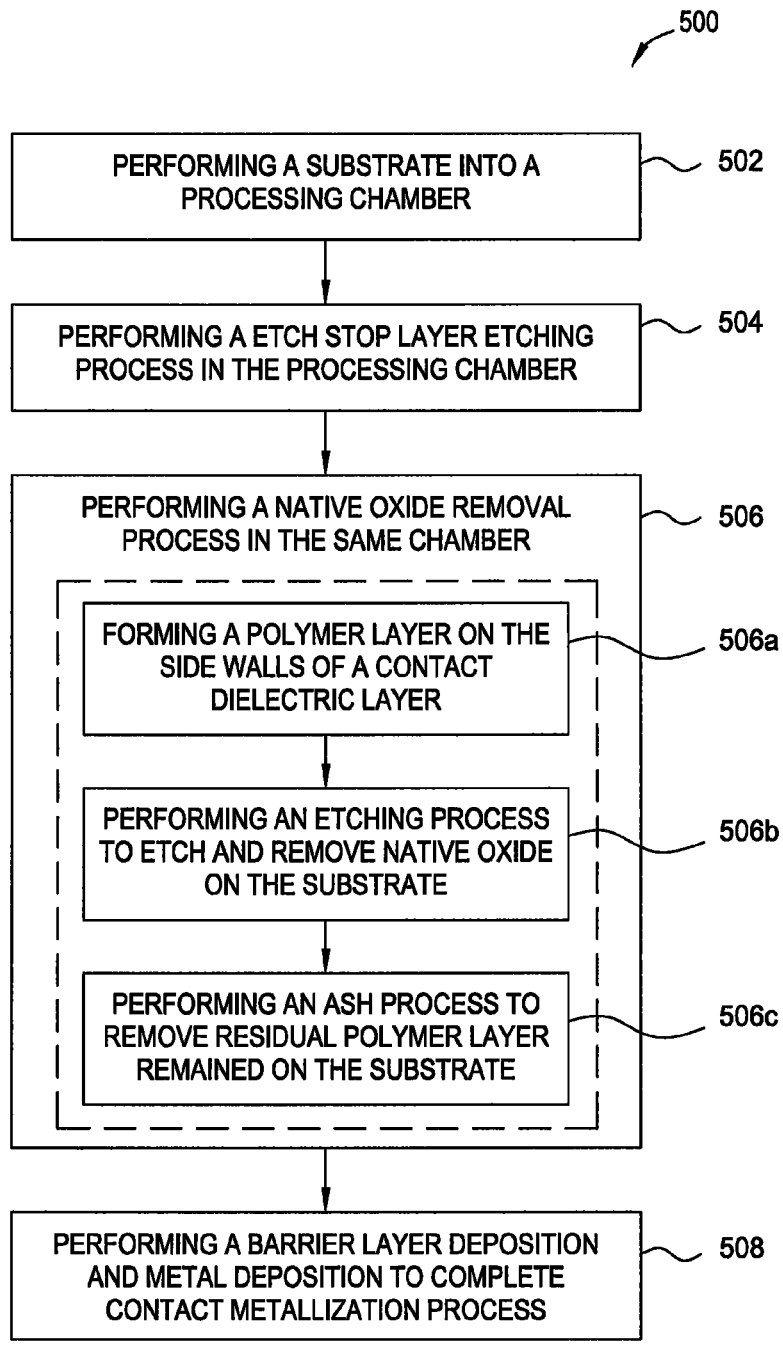
FIG. 5 depicts a flow diagram for manufacturing a contact structure in a semiconductor device in accordance with one embodiment of the present invention.

FIG. 5 illustrates a process sequence 500 used to form a contact structure 100 in a semiconductor device. The sequence described in FIG. 5 corresponds to the fabrication stages depicted in FIGS. 6A-6F, which are discussed below. FIGS. 6A-6F illustrate schematic cross-sectional views of the substrate 102 having the gate structure 108 formed thereon during different stages of fabricating the contact structure 100 illustrated by the processing sequence 500.

Figure 6A:
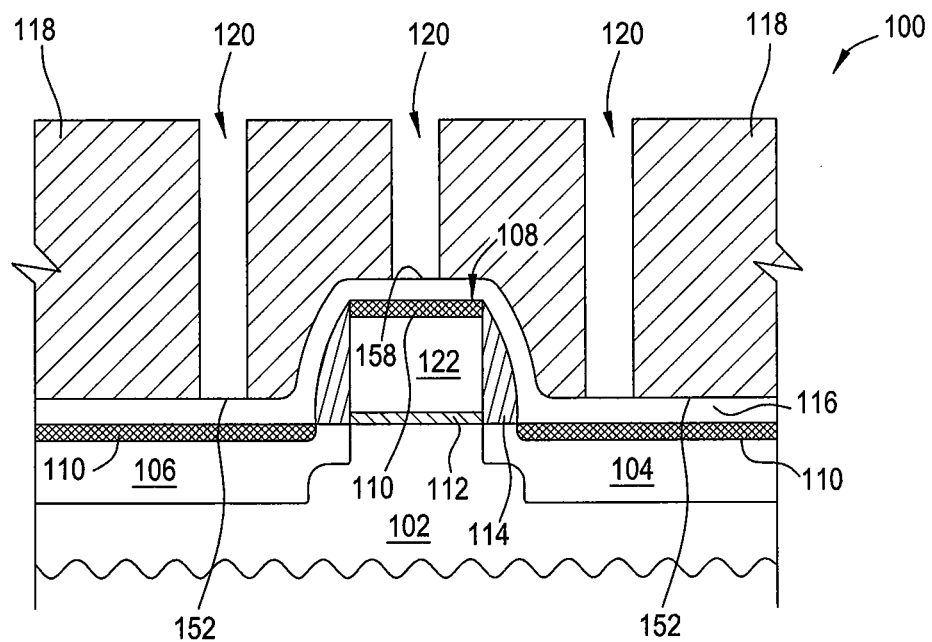
FIGS. 6A-6F depict cross-sectional views of a semiconductor device during the formation of a localized contact structure in accordance with one embodiment of the present invention.

The process sequence 500 starts at step 502 by providing a substrate, such as the substrate 102 depicted in FIG. 6A, into the vacuum chamber, such as the vacuum chamber 319 depicted in FIG. 3. Similar to the structure described in FIG. 1A, the substrate 102 shown in FIG. 6A includes a gate structure 108 formed on the substrate 102. Source and drain regions 106, 104 are formed in the substrate 102 adjacent to the gas structure 108. The gate structure 108 includes a gate dielectric 112, a gate electrode 122 and a contact layer 110. The contact layer 110 is also formed in the source 106 and the drain region 104. An etch stop layer 116 is formed on the substrate 102 covering the gate structure 108. The etch stop layer 116 may be a silicon dielectric layer, such as a SiN layer. A contact dielectric layer 118 is deposited over the etch stop layer 116.

The contact dielectric layer 118 is then patterned to form openings 120 (e.g., vias or trenches) in the contact dielectric layer 118 to facilitate forming contact plugs during the following metallization process. As depicted in FIG. 6A, the contact dielectric layer 118 has been etched to expose portions 152, 158 (e.g., a first portion 152 of the etch stop layer 116 formed on the source 106 and drain region 104, and a second portion 158 of the etch stop layer 116 formed on the contact layer 110 over the gate structure 108) of the underlying etch stop layer 116 for further etching. Accordingly, the first portion 152 and the second portion 158 of the etch stop layer 116 are exposed for etching to further expose the underlying contact layer 110.

In one embodiment, the contact dielectric layer 118 may be a dielectric layer, such as silicon dioxide, organosilicate, carbon doped silicon oxide, phosphosilicate glass (PSG), borophosphosilicate glass (BPSG), silicon nitride, or combinations thereof. The source 106 and drain 104 region may be manufactured by doped polysilicon, such as n-type or p-type doped monocrystalline silicon. The contact layer 110 may be a metal silicide, a silicon based material, a germanium based material, or a silicon based material doped with germanium and/or other dopant. In one embodiment, the contact layer 110 is a metal silicide layer, which may be tungsten, tungsten silicide, titanium, titanium silicide, cobalt silicide, nickel silicide, or combinations thereof. Each layer can be formed using any one or more depositions techniques, such as atomic layer deposition (ALD), cyclical layer deposition (CLD), physical vapor deposition (PVD), chemical vapor deposition (CVD), plasma enhanced chemical vapor deposition (PECVD), evaporation, for example.

Figure 6B:
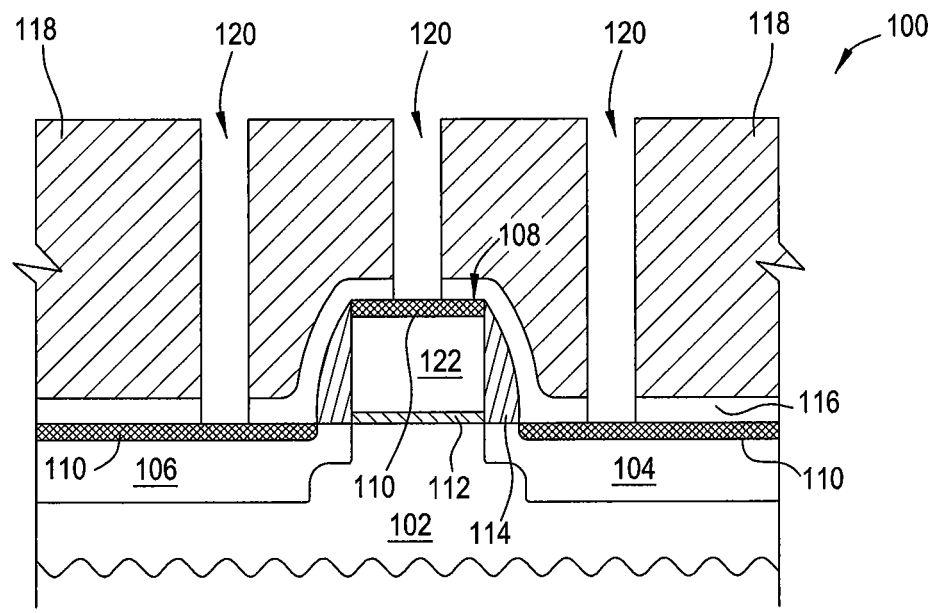

At step 504, an etch stop layer etching process is performed to remove the portions 152, 158 of the etch stop layer 116 from the substrate 102, as shown in FIG. 6B, thereby exposing the underlying layer 110. During the etch stop layer etching process, an etching gas mixture is supplied into the vacuum processing chamber 319 for processing. In one embodiment, the etching gas mixture includes at least one of a halogenated carbon gas or a halogenated hydrocarbon gas. Halogenated carbon gases may include, but are not limited to, fluorocarbons, hydrofluorocarbons, fluorochlorocarbons, and hydrocarbons. The halogenated carbon gas and the halogenated hydrocarbon gas may have a formula $C_xH_yA_z$ (A representing halogen elements including at least one of F, Cl, Br, and the like) where x, y, and z are integers and x has a range between 1 and 10 and y has a range of between 0 and 22 and z has a range of between 0 and 22. Suitable examples of the halogenated carbon gas or the halogenated hydrocarbon gas include $CH_2F_2$, $CF_4$, $CHF_3$, $CF_3(CF_2)_5(CH_2)_2SiCl_3$, $CH_3F$, $C_4F_8$ and the like. In an exemplary embodiment, the etching gas mixture includes a halogenated hydrocarbon gas. In one embodiment, the halogenated hydrocarbon gas used to etch the etch stop layer 116 is $CH_2F_2$. The halogenated carbon gas or the halogenated hydrocarbon gas may be supplied into the vacuum processing chamber 319 at a volumetric flow rate between about 5 sccm and about 2000 sccm.

In one embodiment, other types of gas, such as inert gas or carrier gas, may also be supplied in the etching gas mixture to assist carrying the etching gas mixture into the vacuum processing chamber 319. Suitable examples of the inert gas or carrier gas include at least one of Ar, He, $N_2$, $O_2$, $N_2O$, $NO_2$, NO, and the like. In one embodiment, the inert or carrier gas may be supplied into the vacuum processing chamber 319 at a volumetric flow rate between about 10 sccm and about 5000 sccm.

Several process parameters may also be regulated while the etching gas mixture is supplied into the vacuum processing chamber 319. In one embodiment, the chamber pressure in the presence of the etching gas mixture is regulated. In one exemplary embodiment, a process pressure in the vacuum processing chamber 319 is regulated between about 10 mTorr to about 1000 mTorr, for example, at about 300 mTorr. RF source power may be applied to maintain a plasma formed from the etching gas mixture. For example, a power of about 100 watts to about 1000 watts may be applied to maintain a plasma inside the vacuum processing chamber 319. The etching gas mixture may be flowed into the chamber at a rate between about 5 sccm to about 5000 sccm. A substrate temperature is maintained between about 15 degrees Celsius to about 300 degrees Celsius.

At step 506, a native oxide removal process is performed to remove native oxide from the substrate surface. Native oxide formed on the surface of the contact layer 110 may increase the electrical resistance of the semiconducting material, and adversely affect the electrical conductivity of the contact layer as formed. Therefore, it is desirable to remove the native oxide prior to forming metal contacts or conductors for interconnecting active electronic devices. Therefore, the native oxide removal process as performed at step 506 efficiently removes native oxides and unwanted silicon contaminants from the surface of the contact layer 110, thereby providing a low contact resistance surface that forms a good metal contact surface.

The native oxide removal process as described at step 506 may include a three-step cleaning process (shown as substeps 506a, 506b and 506c in FIG. 5). The three-step cleaning process can be performed as a continuous process in a single chamber without breaking vacuum or transfer among different chambers. The three-step cleaning process employs a chemical reaction process to remove the native oxide while protecting sidewalls of the contact dielectric layer 118 from damage during the native oxide removal process. Unlike the conventional physical sputter cleaning process, the cleaning process as employed herein can chemically reacts with the native oxide formed on the surface of the contact layer 110 to remove the native oxide without using an aggressive ion bombardment process. By doing so, critical dimension and geometry of the openings 120 (e.g., vias or trenches) may be preserved and maintained without alternation after the native oxide removal process.

Figure 2:
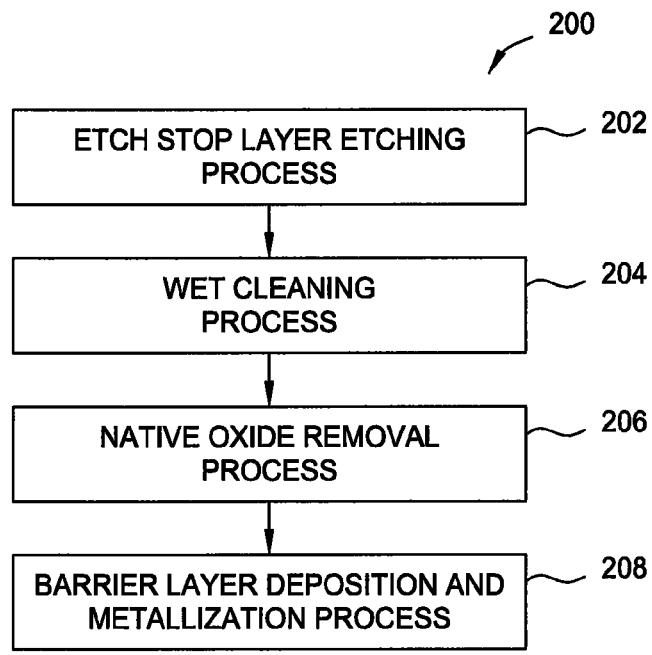
FIG. 2 depicts a diagram of a conventional method utilized to manufacture the contact structure depicted in FIGS. 1A-1C.
Figure 6C:
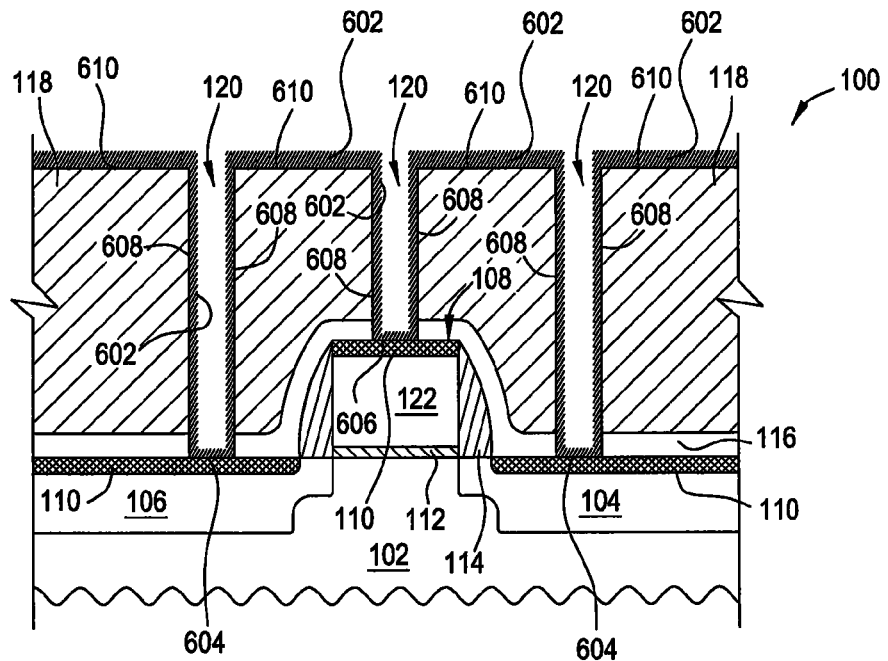

At a first sub-step 506a, a polymer gas mixture is supplied to the vacuum processing chamber, such as the vacuum processing chamber 319 depicted in FIG. 3, to perform a polymer deposition process. The polymer deposition process forms a polymer layer 602 on the top 610, sidewalls 608 and bottoms 604, 606 (above the contact layer 110) of the contact dielectric layer 118, as shown in FIG. 6C. Since the polymer gas mixture supplied at step 506a may be similar to the etching gas supplied at step 504 utilized to etch the etch stop layer 116, therefore, the same processing chamber may be utilized to perform both of the process described at step 504 and step 506a so that the substrate 102 may remain in the same processing chamber under vacuum, thereby reducing the risk of contamination during transfer of the substrate 102 between different chambers or exposing the substrate 102 to an oxidation environment. By maintaining the substrate 102 under the vacuum environment, re-growth of native oxide and introduction of particle or other source of contaminates may be eliminated and reduced, thereby providing good electric quality and electrical integration performance control. In addition, since the etch stop layer etching process at step 504 and the polymer deposition process at step 506a may be performed in the same chamber, the conventional practice of using an additional wet cleaning process, described at step 202 of FIG. 2 discussed above, to clean the substrate surface prior to the native oxide removal process may be efficiently eliminated, thereby reducing manufacture cost and product production cycle time.

In one embodiment, the polymer gas supplied to the processing chamber 319 may include at least one of a halogenated carbon gas or a halogenated hydrocarbon gas. The halogenated carbon gas and the halogenated hydrocarbon gas may have a formula $C_xH_yA_z$ (A representing halogen elements including at least one of F, ClBr and the like) where x, y, z are integers and x has a range between 1 and 10, y has a range of between 0 and 22 and z has a range of between 0 and 22. Suitable examples of the halogenated carbon gas and the halogenated hydrocarbon gas may include $CH_2F_2$, $CF_4$, $CHF_3$, $CF_3(CF_2)_5(CH_2)_2SiCl_3$, $CH_3F$, $C_4F_8$ and the like. In one embodiment, the halogenated hydrocarbon gas used to form the polymer layer 602 on the top 610, sidewall 608, and bottoms 604, 606 (above the contact layer 110) of the contact dielectric layer 118 is $CH_2F_2$. The halogenated carbon gas or the halogenated hydrocarbon gas may be supplied into the processing chamber 319 at a volumetric flow rate between about 5 sccm and about 2000 sccm.

In one embodiment, the polymer layer 602 formed on the substrate 102 may have a greater thickness on the top 610 of the contact dielectric layer 118 than on the bottom 604. As the reactive ions present while forming the polymer layer 602 may not efficiently reach down to the bottom 604 of the contact dielectric layer 118, the thickness of the polymer layer 602 formed on the bottom 604 (right above the contact layer 110) may be relatively thinner than the thickness of the polymer layer 602 formed on the top 602. In one embodiment, the polymer layer 602 formed on the top of the contact dielectric layer 118 may have a thickness between about 100 percent and 300 percent more than that of formed on the bottom 604. Therefore, a polymer layer is formed on the substrate 102 non-conformally and non-uniformly.

During the polymer deposition process, several process parameters may be regulated to control the deposition process. In one exemplary embodiment, a process pressure in the vacuum processing chamber 319 is regulated between about 10 mTorr to about 2000 mTorr, for example, at about 300 mTorr. A RF source power may be applied to maintain a plasma formed from the polymer gas mixture. For example, a power of about 200 watts to about 2000 watts may be applied to maintain a plasma inside the vacuum processing chamber 319. The polymer gas mixture may be flowed into the chamber at a rate between about 20 sccm to about 5000 sccm. A substrate temperature is maintained between about 15 degrees Celsius to about 300 degrees Celsius.

Figure 6D:
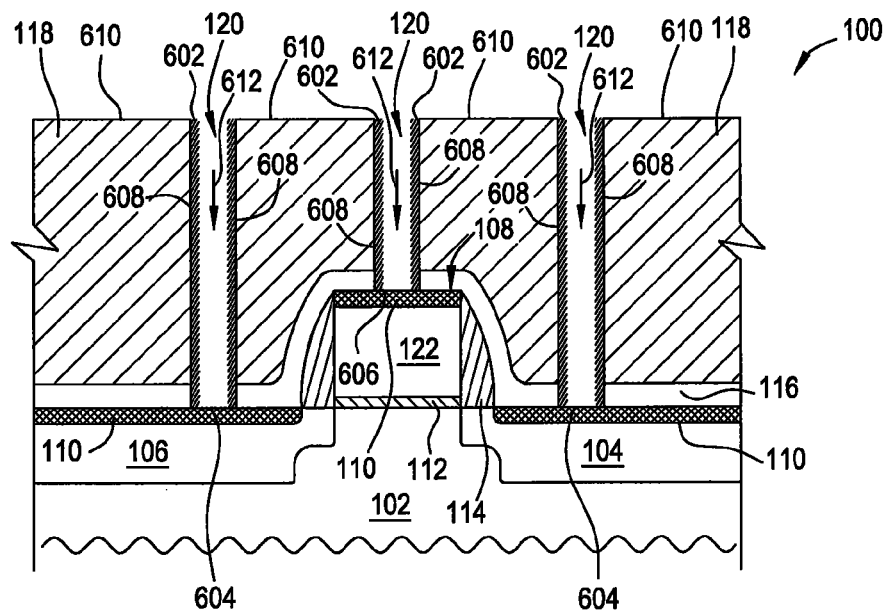

At a second sub-step 506b, a polymer etching process is performed to etch a portion of the polymer layer 602 from the substrate 102 as well as removing the native oxide from the substrate so as to expose the underlying contact layer 110, as shown in FIG. 6D. During the polymer etching process, an etching gas mixture is supplied into the vacuum processing chamber 319 to activate ions present in polymer layer 602. The activated ions then chemically react with the native oxide on the substrate, forming volatile gas byproduct which readily pumps out of the vacuum processing chamber 319. For example, during reaction, carbon ions (e.g., or other reactive ions) activated from the polymer layer 602 are energized and react with the oxygen ions, silicon ions, and/or nitrogen ions formed in the native oxide, thereby forming gas phase carbon oxide, silicon species, nitrogen containing carbon oxide which are readily pumped out of the vacuum processing chamber 319.

When performing the polymer etching process at the second sub-step 506b, a RF bias power is applied during the etching process to accelerate and drive the ions dissociated from the etching gas mixture toward the substrate surface. For example, a first portion of the accelerated ions is then driven toward the top surface 610 of the substrate 102 while a second portion of the accelerated ions are driven deeper down in the openings 120 to the bottom 604 of the contact dielectric layer 118 above the contact layer 110. The RF bias power applied during the etching process assists enabling an anisotropic etching process, thereby efficiently driving the accelerated ions to travel deep down the openings 120 to the bottom 606, 604 to activate the chemical reaction with the native oxides present below the polymer layer 602. After the accelerated ions in the polymer layer 602 react with the native oxide to form volatile gas byproduct, the native oxide is then efficiently removed from the substrate surface.

In one embodiment, the etching gas mixture supplied at the second sub-step 506b includes at least an inert gas, such as Ar or He, a carrier gas, such as $N_2$, $N_2O$, $NO_2$, NO or the like, a halogen containing gas, such as HF, $CF_4$, $Cl_2$, or the like, or other suitable gas that can chemically react with native oxides. In an exemplary embodiment, the etching gas mixture supplied at the second sub-step 506b is Ar gas. It is believed that Ar gas can provide sufficient momentum, to energize and activate the ions in the polymer layer 602 and further carry the energized/activated ions further down through the openings 120 to react with the native oxide formed on the contact layer 110. Furthermore, as discussed above, the thickness of the polymer layer 602 formed on the top 610 of the contact dielectric layer 118 is higher than the polymer layer 602 formed on the bottom 604, 606. Therefore, when the polymer layer 602 located at the bottom 604, 606 is substantially consumed during the etching process, exposing the underlying native oxide for removal, the polymer layer 602 located on the top 610 of the contact conductive layer 118 may still have some remaining thickness which protects the top 610 from over-etching. Therefore, it is believed that the non-conformal deposition of the polymer layer 602 may assist removing the native oxide formed on the deep-down bottom 604, 606 of the openings 120 without adversely overly etching of the top surface 610. Furthermore, since the anisotropic etching process can minimize attack on the polymer layer 602 formed on the top 610, and the sidewall 608 of the openings 120, sidewall 608 may still be protected by the polymer layer 602 remained on the substrate 102 without being undesirably damaged while the native oxide on the bottom 604, 606 is removed.

In one embodiment, the etching gas mixture supplied at the sub-step 506b is Ar controlled at a flow rate between about 50 sccm and about 2000 sccm.

During the native oxide etching process, several process parameters may be regulated to control the etching process. In one exemplary embodiment, a process pressure in the vacuum processing chamber 319 is regulated between about 20 mTorr to about 2000 mTorr, such as between about 100 mTorr and about 300 mTorr, for example, at about 260 mTorr. A RF source power may be applied to maintain a plasma in the etching gas mixture. For example, a power of about 100 watts to about 2000 watts may be applied to maintain a plasma inside the vacuum processing chamber 319. A RF bias power between about 50 watts and about 500 watts, such as about 80 watts and about 200 watts, for example about 150 watts, may also be applied to the pedestal 321 to provide a bias power to accelerate ions in a direction toward the substrate surface. The etching gas mixture may be flowed into the chamber at a rate between about 20 sccm to about 5000 sccm. A substrate temperature is maintained between about 15 degrees Celsius to about 300 degrees Celsius.

Figure 6E:
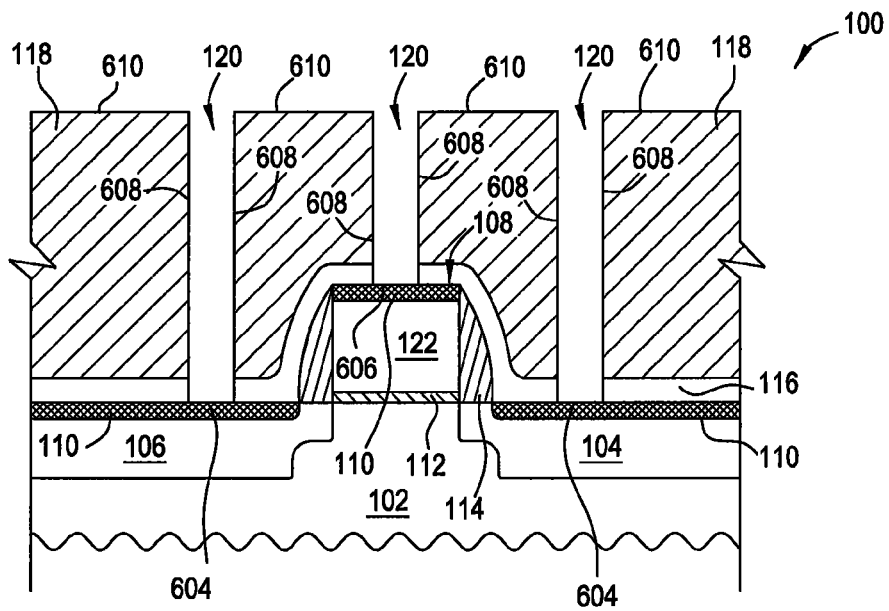

At sub-step 506c, an ash process is performed to remove the polymer layer 602 or other remaining carbon residuals from the substrate 102, as shown in FIG. 6E. As discussed, as the polymer layer 602 is formed on the substrate surface during the etching process (e.g., the native oxide removal process), after the etching process is completed, an ash process is performed to remove the remaining polymer layer 602 or other residuals, such as the polymer layer 602 remaining on the sidewall 608 and/or top 610 of the contact dielectric layer 118, from the substrate 102. The ash process may be performed by supplying an ashing gas comprising at least one of an oxygen containing gas, a hydrogen containing gas or an inert gas into the vacuum processing chamber 319 to react with the polymer layer 602 and form a carbon oxide gas, a carbon hydrogen gas or other carbon containing gas which can be pumped out of the chamber. In one embodiment, the ashing gas that may be utilized to perform the ash process includes $O_2$, $H_2$, $H_2O$, He, Ar, $O_3$, and the like. In another embodiment, the ashing gas utilized to perform the ash process includes a hydrogen containing gas, such as $H_2$, which may be diluted with an inert gas such as He, Ar and the like. When an ashing gas such as hydrogen containing gas is utilized, the ashing gas may be oxygen free to prevent reformation of oxides on the surface of the substrate.

During the ash process, several process parameters may be regulated to control the ash process. In one exemplary embodiment, a process pressure in the vacuum processing chamber 319 is regulated between about 10 mTorr to about 2000 mTorr, for example, at about 80 mTorr. A RF source power may be applied to maintain a plasma in the etching gas mixture. For example, a power of about 100 watts to about 200 watts may be applied to maintain a plasma inside the vacuum processing chamber 319. The ash gas mixture may be flowed into the chamber at a rate between about 20 sccm to about 5000 sccm. A substrate temperature is maintained between about 15 degrees Celsius to about 300 degrees Celsius.

Figure 6F:
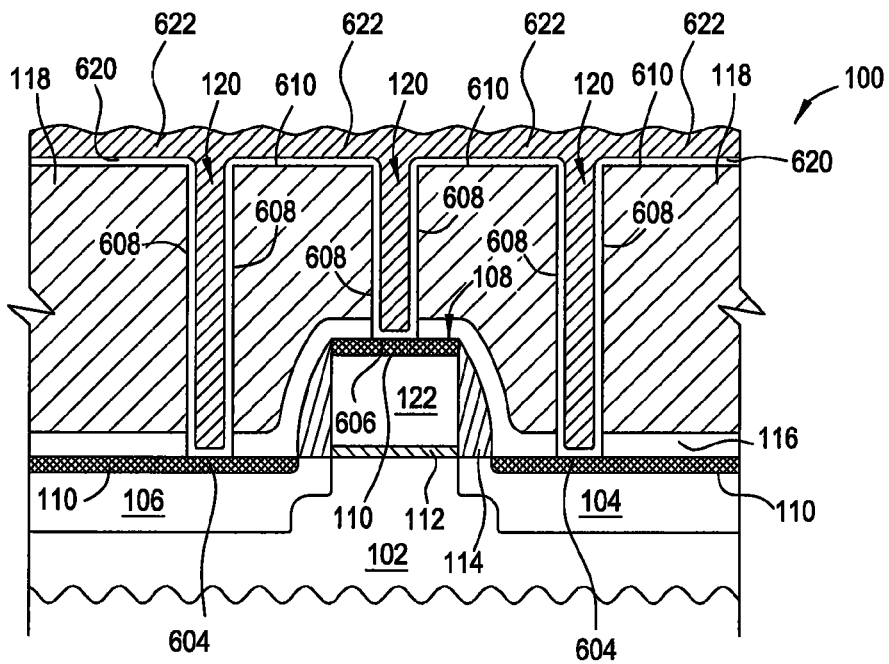

At step 508, after the native oxide is removed from the substrate 102, the cleaned contact surface is ready for metallization to form vias, lines, and other interconnect features, as shown in FIG. 6F. Accordingly, a metallization process, including a barrier layer deposition process to form a barrier layer 620 and a contact plug deposition process to form a contact plug 622, is performed. In one embodiment, the barrier layer deposition process may be a CVD, MOCVD, ALD, LPCVD, PVD process, or any suitable deposition process, configured to form a metals or metal nitrides, such as titanium, titanium nitride, titanium silicide nitride, tungsten, tungsten nitride, tungsten silicide nitride, tantalum, tantalum nitride, tantalum silicide nitride, or combinations thereof. The contact plug deposition process may also be a CVD, MOCVD, ALD, LPCVD, PVD process, or any suitable deposition process configured to form a seed layer, a nucleation, a bulk layer, a fill layer, or other suitable conductive metal layer that may be used to form an interconnect. Suitable examples of the contact plug may be tungsten, copper, titanium, aluminum, tantalum, ruthenium, cobalt, alloys thereof, or combinations thereof.

The native oxide removal process described at step 506 is also effective in removing oxide from a surface comprising at least one of silicon or germanium. These surfaces may include oxides such as $SiO_x$ and $GeO_x$ that can be removed utilizing the three-step cleaning process (shown as sub-steps 506a, 506b and 506c in FIG. 5). The three-step cleaning process can be performed as a continuous process in a single chamber without breaking vacuum or transfer among different chambers.

Thus, a method and an apparatus for removing oxide from a surface comprising at least one of silicon and germanium, such as for forming a contact structure and removing native oxide on a metal silicide layer in the contact structure are provided. The method and apparatus advantageously integrate both the etch stop layer etching process and the native oxide removal process in a single chamber, thereby eliminating native oxide growth and exposure to other contaminates redeposit during the substrate transfer processes. Furthermore, the method and the apparatus also provides the improved three-step chemical reaction process that efficiently removes native oxides from the metal silicide layer without adversely altering the geometry of the contact structure and the critical dimension of the trenches or vias formed in the contact structure.

While the foregoing is directed to embodiments of the present invention, other and further embodiments of the invention can be devised without departing from the basic scope thereof, and the scope thereof is determined by the claims that follow.

What is claimed is:

1. A method for removing oxide from a surface disposed on a substrate, comprising:
   forming a polymer layer on an oxide layer formed on a surface, the surface comprising at least one of silicon or germanium;
   activating the polymer layer to react with the oxide layer to form gas phase byproduct, and wherein forming a polymer layer comprises supplying a halogenated carbon gas or a halogenated hydrocarbon gas into a vacuum processing chamber; and
   performing an ash process to remove the polymer from the substrate.

2. The method of claim 1, wherein the activating the polymer layer further comprises:
   supplying an inert gas into the vacuum processing chamber.

3. The method of claim 2, wherein the activating the polymer layer further comprises:
   applying a RF bias power to the processing chamber while supplying the inert gas.

4. The method of claim 1, wherein the performing an ash process further comprises:
   supplying an oxygen-free, hydrogen containing gas into the vacuum processing chamber.

5. The method of claim 1, wherein the halogenated hydrocarbon gas is $CH_2F_2$.

6. The method of claim 1, wherein the surface is a metal silicide.

7. The method of claim 1, wherein the oxide is $GeO_x$.

8. A method for forming a contact structure on a substrate comprising:
   supplying a polymer gas mixture into a vacuum processing chamber to form a polymer layer on an oxide layer present on a surface exposed through an opening formed through a contact dielectric layer, the surface comprising at least one of silicon or germanium;
   supplying an etching gas mixture to remove the oxide layer formed on a metal silicide layer; and
   performing an ash process to remove the polymer layer remaining on the substrate.

9. The method of claim 8, wherein the supplying the polymer gas mixture further comprises:
   forming the polymer layer on top of the contact dielectric layer, sidewalls of the openings of the contact dielectric layer and a surface of the metal silicide layer.

10. The method of claim 9, wherein the polymer layer formed on the top of the contact dielectric layer has a thickness between about 100 percent and about 300 percent thicker than a thickness of the polymer layer formed on the surface of the metal silicide layer.

11. The method of claim 8, wherein the polymer gas mixture comprises $CH_2F_2$, $CF_4$, $CHF_3$, $CF_3(CF_2)_5(CH_2)_2SiCl_3$, $CH_3F$ or $C_4F_8$.

12. The method of claim 8, wherein the supplying the etching gas mixture further comprises:
   applying a RF bias power to the substrate while supplying the etching gas mixture into the vacuum processing chamber.

13. The method of claim 8, wherein the etching gas mixture includes an inert gas.

14. The method of claim 8, wherein an etch stop layer is disposed between the metal silicide layer and the contact dielectric layer.

15. The method of claim 8, wherein the surface is a metal silicide.

16. The method of claim 8, wherein the oxide is $GeO_x$.

17. A method for forming a contact structure on a substrate comprising:
  etching an etch stop layer formed on a substrate disposed in a vacuum processing chamber to expose an oxide layer formed on a surface of underlying layer formed beneath the etch stop layer, the surface comprising at least one of silicon or germanium; and
  removing the oxide layer formed on the surface of the underlying layer in the same vacuum processing chamber, wherein removing the oxide layer formed on the surface of the underlying layer comprises:
    forming a polymer layer on the oxide layer formed on the surface of the underlying layer, wherein forming a polymer layer comprises supplying a polymer gas mixture comprising a halogenated carbon gas or a halogenated hydrocarbon gas into the vacuum processing chamber.

18. The method of claim 17, wherein the removing the oxide layer formed on the surface of the underlying layer further comprises:
  activating the polymer layer to react with the oxide layer; and
  performing an ash process to remove the polymer from the substrate.

19. The method of claim 18, wherein the activating the polymer layer to react with the oxide layer further comprises:
  applying a RF bias power to the substrate while activating the polymer layer.

20. The method of claim 17, wherein the etching the etch stop layer further comprises:
  supplying an etch stop layer etching gas mixture comprising $CH_2F_2$, $CF_4$, $CHF_3$, $CF_3(CF_2)_5(CH_2)_2SiCl_3$, $CH_3F$ or $C_4F_8$.

21. The method of claim 17,
  wherein the polymer gas mixture comprises $CH_2F_2$, $CF_4$, $CHF_3$, $CF_3(CF_2)_5(CH_2)_2SiCl_3$, $CH_3F$ or $C_4F_8$.

22. The method of claim 17, wherein the underlying layer is a metal silicide.

23. The method of claim 17, wherein the oxide is $GeO_x$.

* * * * *

UNITED STATES PATENT AND TRADEMARK OFFICE
CERTIFICATE OF CORRECTION

PATENT NO. : 8,642,473 B2  Page 1 of 1
APPLICATION NO. : 13/411398
DATED : February 4, 2014
INVENTOR(S) : Mei Chang et al.

It is certified that error appears in the above-identified patent and that said Letters Patent is hereby corrected as shown below:

In the Specification

Column 8, Line 57, please delete "ClBr" and insert -- Cl, Br -- therefor.

Signed and Sealed this
Third Day of June, 2014

Michelle K. Lee
*Deputy Director of the United States Patent and Trademark Office*